(12) United States Patent
Bickell et al.

(10) Patent No.: US 11,387,026 B2
(45) Date of Patent: Jul. 12, 2022

(54) ASSEMBLY COMPRISING A CYLINDRICAL STRUCTURE SUPPORTED BY A SUPPORT STRUCTURE

(71) Applicant: Siemens Healthcare Limited, Camberley (GB)

(72) Inventors: William James Bickell, Witney (GB); Ashley Fulham, Hinkley (GB); Martin Gambling, Rugby (GB); Martin Howard Hempstead, Ducklington (GB); Graeme Hyson, Milton Keynes (GB); Paul Lewis, Witney (GB); Nicholas Mann, Compton (GB); Michael Simpkins, High Wycombe (GB)

(73) Assignee: Siemens Healthcare Limited, Chamberley (GB)

( * ) Notice: Subject to any disclaimer, the term of this patent is extended or adjusted under 35 U.S.C. 154(b) by 87 days.

(21) Appl. No.: 16/771,560

(22) PCT Filed: Nov. 21, 2018

(86) PCT No.: PCT/EP2018/082101
§ 371 (c)(1),
(2) Date: Jun. 10, 2020

(87) PCT Pub. No.: WO2019/115189
PCT Pub. Date: Jun. 20, 2019

(65) Prior Publication Data
US 2021/0183551 A1    Jun. 17, 2021

(30) Foreign Application Priority Data

Dec. 11, 2017  (GB) ...................................... 1720576

(51) Int. Cl.
*H01F 6/00*    (2006.01)
(52) U.S. Cl.
CPC ..................................... *H01F 6/00* (2013.01)
(58) Field of Classification Search
CPC .......................................................... H01F 6/00
USPC ......................................................... 335/216
See application file for complete search history.

(56) References Cited

U.S. PATENT DOCUMENTS

| 2,025,789 | A |   | 12/1935 | Templin et al. |
|---|---|---|---|---|
| 3,133,144 | A | * | 5/1964 | Cottingham ............ F17C 3/085 174/15.4 |
| 4,595,899 | A | * | 6/1986 | Smith ................... G01R 33/385 324/320 |
| 4,660,013 | A |   | 4/1987 | Laskaris et al. |

(Continued)

FOREIGN PATENT DOCUMENTS

| CN | 205654973 U | 10/2016 |
|---|---|---|
| GB | 2441795 A | 3/2008 |

(Continued)

*Primary Examiner* — Alexander Talpalatski
(74) *Attorney, Agent, or Firm* — Banner & Witcoff, Ltd.

(57) ABSTRACT

An assembly having a cylindrical structure supported by a support structure having at least one support element, the support structure being cradle shaped, such that vertical and horizontal loads are taken largely as shear forces by respective interface surfaces which are substantially parallel to the direction of the respective load, and vertical loads are taken in a direction substantially tangential to the cylindrical surface of the cylindrical structure.

12 Claims, 2 Drawing Sheets

(56) References Cited

U.S. PATENT DOCUMENTS

| | | | |
|---|---|---|---|
| 4,822,772 A | 4/1989 | Huson | |
| 7,646,272 B1 * | 1/2010 | Schmierer | H01F 6/00 335/216 |
| 8,028,853 B2 * | 10/2011 | Hobbs | G01R 33/3804 220/560.1 |
| 8,803,524 B2 * | 8/2014 | Dempsey | G01R 33/3806 324/318 |
| 10,527,693 B2 * | 1/2020 | Heid | G01R 33/3802 |
| 2006/0006866 A1 | 1/2006 | Roozen et al. | |

FOREIGN PATENT DOCUMENTS

| | | |
|---|---|---|
| JP | S63132642 A | 6/1988 |
| JP | S63118208 U | 7/1988 |

\* cited by examiner

ASSEMBLY COMPRISING A CYLINDRICAL STRUCTURE SUPPORTED BY A SUPPORT STRUCTURE

TECHNICAL FIELD

The present disclosure relates to superconducting magnets, and particularly relates to arrangements for retaining superconducting magnet structures in position within a vacuum vessel.

BACKGROUND

Conventionally, superconducting magnet coil arrangements are held in position with rigid formers, for example of steel or aluminium, mounted within encompassing cryogen vessels, for example made of stainless steel. Modern designs may not include such encompassing cryogen vessels. The present disclosure provides a viable support arrangement for such superconducting magnet structures.

While, conventionally, superconducting magnet structures have been cooled by partial immersion in liquid cryogen contained within an enveloping cryogen vessel, recent advances mean that an enveloping cryogen vessel may no longer be required.

Where no enveloping cryogen vessel is provided, the superconducting magnet structure is directly affected by heat and mechanical loads from a support arrangement used to bear the weight of the superconducting magnet structure. When no enveloping cryogen vessel is used, it has been conventional to use load isolating structures to protect the magnet from the concentrated loads caused by conventional suspension elements. Such arrangements are found to be expensive and complicated to assemble, with a relatively high parts count. Costly interface features are required to be mounted on the vacuum vessel, and the magnet structure or enveloping cryogen vessel if provided. This problem arises in modern designs of superconducting magnet assembly which do not employ an encasing cryogen vessel. The superconducting magnet structure must be appropriately supported without causing flexure. It is therefore desired to provide a cost effective support system that minimises loads on the superconducting magnet structure.

Alternative concepts in which the multiple tension suspension elements are replaced by a single tubular suspension element have already been described, for example in GB2441795A "Tubular Support System for Superconducting Magnet" and GB2469203A "A Supported Superconducting Magnet". These documents each describe a generally tubular support structure primarily intended to interface with a generally cylindrical enveloping cryogen vessel. The arrangements described in these documents have the advantage of transmitting the weight of the superconducting magnet to an external support structure, such as a floor, without the weight first having to be borne by the vacuum vessel. This removes some of the necessity of providing interface features on the vacuum vessel, and may enable thinner material to be used for the vacuum vessel, reducing weight and material cost. The described arrangements still require relatively strong connection points at each end of the generally tubular support, typically to an enveloping cryogen vessel. They are thus difficult to interface with superconducting magnet structures where there is no enveloping cryogen vessel. To cope with the absence of an enveloping cryogen vessel, potentially costly features are required at the interface between the generally tubular support and the vacuum vessel.

SUMMARY

According to the present disclosure, a new support structure is provided for a superconducting magnet structure enclosed within a vacuum vessel. It is particularly applicable to superconducting magnets which do not have an enveloping cryogen vessel. It may also be applied to the support of other cylindrical structures.

The present disclosure accordingly provides structures as defined in the appended claims.

BRIEF DESCRIPTION OF THE DRAWINGS

The advantages, characteristics and features of present disclosure will be more clearly understood by reference to the following description of certain embodiments thereof, in combination with the accompanying drawings, wherein.

DETAILED DESCRIPTION

Figure 1:
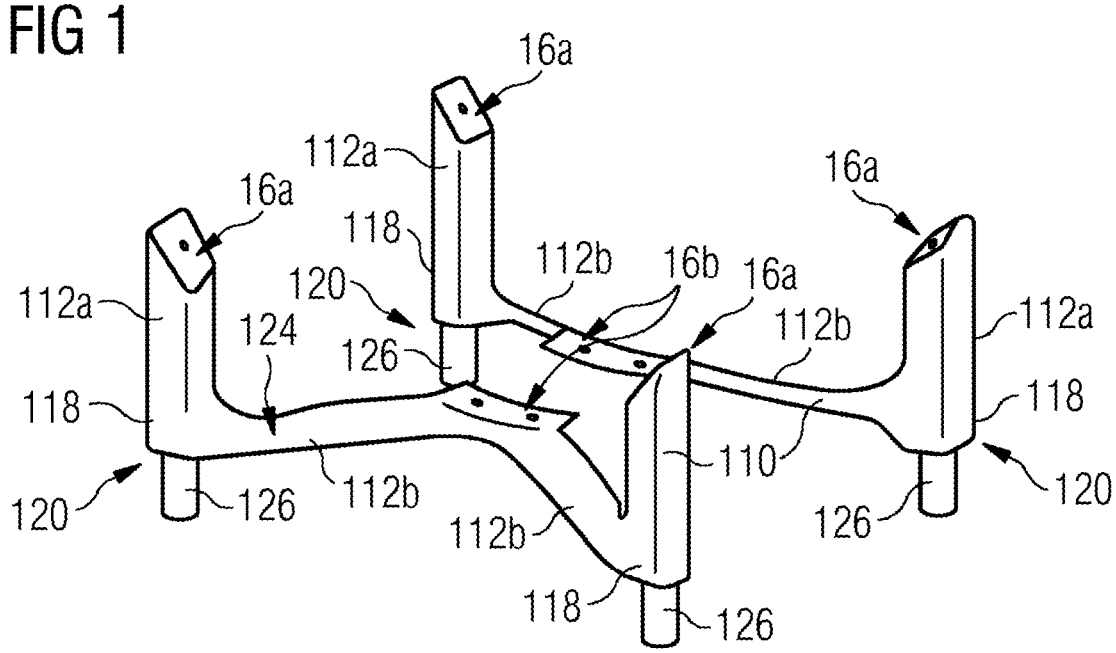
FIG. 1 shows an example embodiment of a support structure as used in an embodiment of the present disclosure.

The present disclosure provides an assembly comprising a cylindrical structure supported by a support structure, and more particularly a support structure for supporting a superconducting magnet structure within a vacuum vessel. The vacuum vessel may alternatively be known as Outer Vacuum Chamber or OVC.

The support structure of the present disclosure is adapted to minimise undesirable effects on the superconducting magnet structure and facilitate simplification of the vacuum vessel.

According to a feature of the disclosure, a support is provided, which is shaped to cradle the superconducting magnet structure whilst minimising heat flow to the superconducting magnet structure from the vacuum vessel. In particular, vertical and horizontal loads are taken largely as shear forces by interface surfaces which are substantially parallel to the direction of the load. Vertical loads are taken in a direction substantially tangential to the cylindrical surface of the superconducting magnet assembly.

Multiple supporting elements may be provided for a single superconducting magnet structure, rather than just one.

Each supporting element may be overall cradle-shaped, to provide support to a flexible magnet structure.

Each supporting element may have tailored stiffness to accommodate differential thermal expansion between the support element, the superconducting magnet structure and a thermal radiation shield, if present, which is typically made of aluminium. The tailored stiffness provides elements which have different stiffnesses in different directions, to enable mechanical support which minimises flexure of the superconducting magnet assembly.

Each supporting element may include a single molded surface to facilitate a simple manufacturing process in that other surfaces of the supporting element need not be molded.

Each supporting element may include features to provide support for a thermal radiation shield. Such features may incorporate a thermal intercept. Such features may have controlled stiffness to ensure appropriate interface with the thermal radiation shield. The purpose of the thermal intercept is to reduce the flow of heat from the OVC to the magnet. It does this by forcing the temperature of a part of the support structure to be at the same temperature as the thermal shield which in turn is connected to the first stage of the refrigerator. This may be achieved by providing a support bracket for the thermal shield which is thermally connected to the support structure at a chosen location, and to the thermal radiation shield.

In some embodiments, part of the support structure may be of glass-reinforced-plastic (GRP), while another part may be of carbon-fibre-reinforced-plastic (CFRP). In a particular embodiment, a cradle surface part may be in CFRP while a tubular support tube may be in GRP. Such arrangements benefit from the changes in thermal conductivity of these materials at different temperatures.

The support structure of the present disclosure may be used with superconducting magnet structures which have no enveloping cryogen vessel. The support structure of the present disclosure has a cradle interface with the superconducting magnet structure, reducing the effect of point loading onto the superconducting magnet structure.

FIG. 1 shows an example embodiment of a support structure of the present disclosure. In the illustrated embodiment, the support structure is provided as a combination of two separate parts, referred to herein as support elements 110.

In the embodiment of FIG. 1, the cradle interface of each support element 110 is provided in three separate partial cradle surfaces 16a, 16b. In other embodiments (not shown), the cradle interface may be divided into two, or more than three, separate partial cradle surfaces.

In the embodiment shown in FIG. 1, two separate support elements 110 are provided, each comprising three partial cradle surfaces 16a, 16b joined by corresponding supporting struts 112a, 112b. In this embodiment, each outer partial cradle surface 16a is supported by a single supporting strut 112a, while the inner partial cradle surface 16b is supported by two supporting struts 112b. Each support element 110 may be described as a "W-frame" support structure due to its overall configuration, although other configurations of supporting struts 112a, 112b may be employed, within the scope of the present disclosure.

A preferred method of manufacture of the W-frame supports 110 ensures that only one surface is molded, to simplify the manufacturing method and enable a low-cost manufacturing method. However, W-frame supports 110 may be manufactured by other commercially available composite manufacturing processes, such as resin infusion, machining from a block or additive manufacturing. Selection of an appropriate manufacturing method will partially depend on manufacturing volumes.

A mould may have a surface corresponding to the partial cradle surfaces 16a, 16b, surfaces 120 of foot regions 118 and a surface 124 joining those surfaces together. Resin-impregnated fibre, such as glass fibre cloth or carbon fibre cloth, is laid over the mould surface to a suitable thickness and the resin caused or allowed to cure. Once cured, the resulting support structure is removed from the mould surface. In this way, the surfaces which need to be accurately formed, that is, the partial cradle surfaces 16a, 16b and the surfaces 120 of the foot regions 118, are accurately formed without an unnecessarily complicated moulding process.

By selecting orientation of fibres in the glass fibre cloth or carbon fibre cloth, and the number of layers in any given region, stiffness of different regions of each W-frame support structure 110 may be tailored to suit their functions, and to provide desired mechanical characteristics to the support structure for supporting a superconducting magnet structure within a vacuum vessel.

In preferred embodiments of the present disclosure, each W-frame support structure 110 is formed as a single moulding, which may be in GRP or CFRP or a suitable combination, or other suitable materials which may be composite materials.

In certain embodiments of the present disclosure, a thermal radiation shield 26 is interposed between the superconducting magnet structure 12 and a vacuum vessel 14. Features may be provided on each W-frame support structure 110 to support the thermal radiation shield. Such features may preferably provide thermal conduction between the thermal radiation shield and the support structure, so as to provide a thermal intercept as outlined above.

The separation of the cradle interface into partial cradle surfaces 16a, 16b enables support over a wider circumferential arc of radially outer surface 44 (FIG. 2) of the superconducting magnet structure 12 while minimising any stresses due to different thermal expansion and contraction of the superconducting magnet structure 12 and the W-frame support(s) 110.

Figure 2:
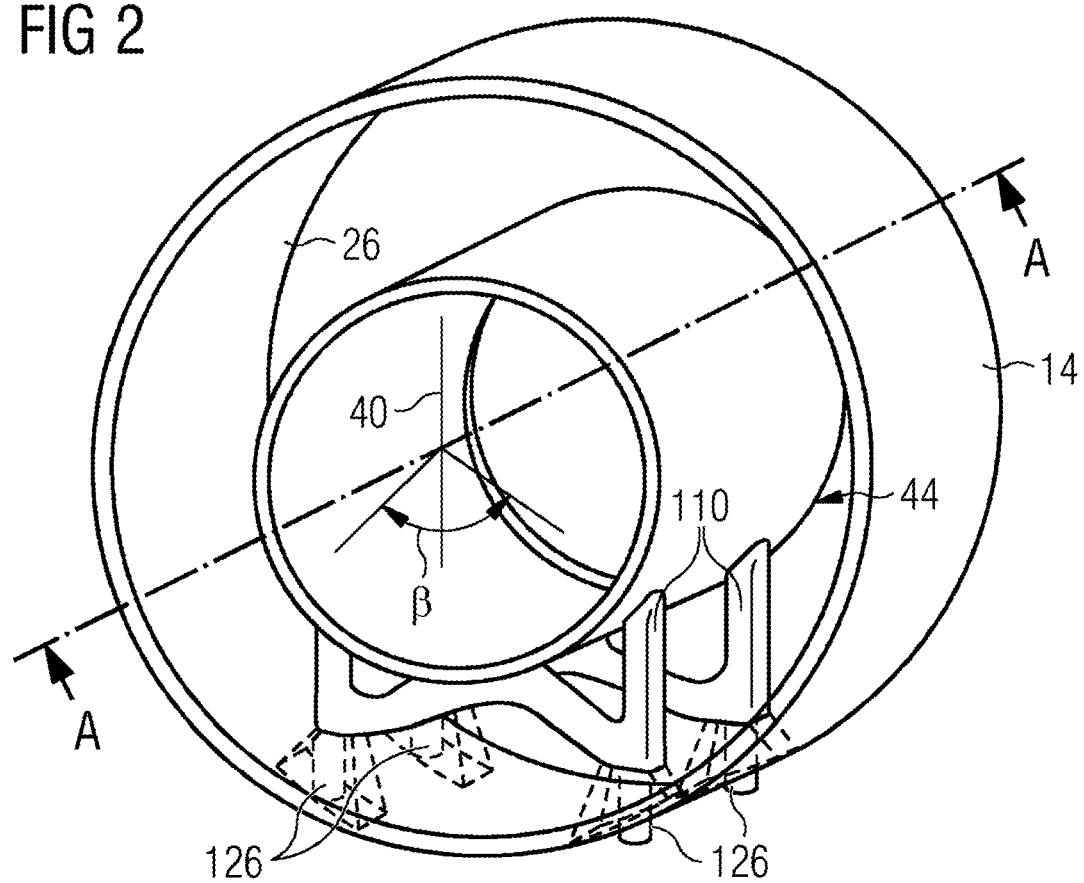
FIG. 2 shows an example embodiment of the present disclosure.

As illustrated in FIG. 2, circumferential extremities of partial cradle surfaces 16a subtend an angle β at the cylindrical axis A-A of the cylindrical superconducting magnet structure 12. This angle preferably lies in the range 90°-150° but may be between 60 and 180°.

As illustrated in FIG. 2, two W-frame supports 110 are preferably provided, positioned with reflective symmetry about a plane perpendicular to the axis A, at the axial mid-point of the superconducting magnet structure. The W-frame support structures 110 may be positioned differently, but the arrangement shown is mechanically stable.

FIG. 2 also shows thermal radiation shield 26 which is interposed between the superconducting magnet structure 12 and the vacuum vessel 14. As shown in FIG. 2, but more clearly visible in FIG. 1, support elements 126 are provided between the thermal radiation shield 26 and the vacuum vessel 14. These support elements 126 may be in the form of GRP tubes, while the W-frame support structures 110 may be of CFRP. By making the W-frame supports 110 of CFRP and positioning GRP tubes 126 between thermal radiation shield 26 and the vacuum vessel 14, a minimal thermal conduction may be obtained between the ambient temperature of the vacuum vessel, typically about 300K, and the cryogenic temperature, of the thermal radiation shield.

The vacuum vessel 14 will itself be supported on a vacuum vessel support 50 for example as shown in FIG. 6, and support elements 126 will bear upon the inner surface of cryogen vessel 14 at hard points 200, defined by contact with vacuum vessel support 50. The vacuum vessel support 50 may take different forms. In a preferred embodiment, the vacuum vessel support 50 is integrated with the OVC.

Although support elements 126 have been described as GRP tubes, they may be replaced by structures of other shapes and materials, provided that such structures meet relevant requirements for mechanical strength and thermal conductivity.

Partial cradle surfaces 16a, 16b are preferably joined to the radially outer surface 44 of the superconducting magnet structure 126 by bonding, bolting or other suitable methods, but could simply be joined at a friction interface.

Figure 3:
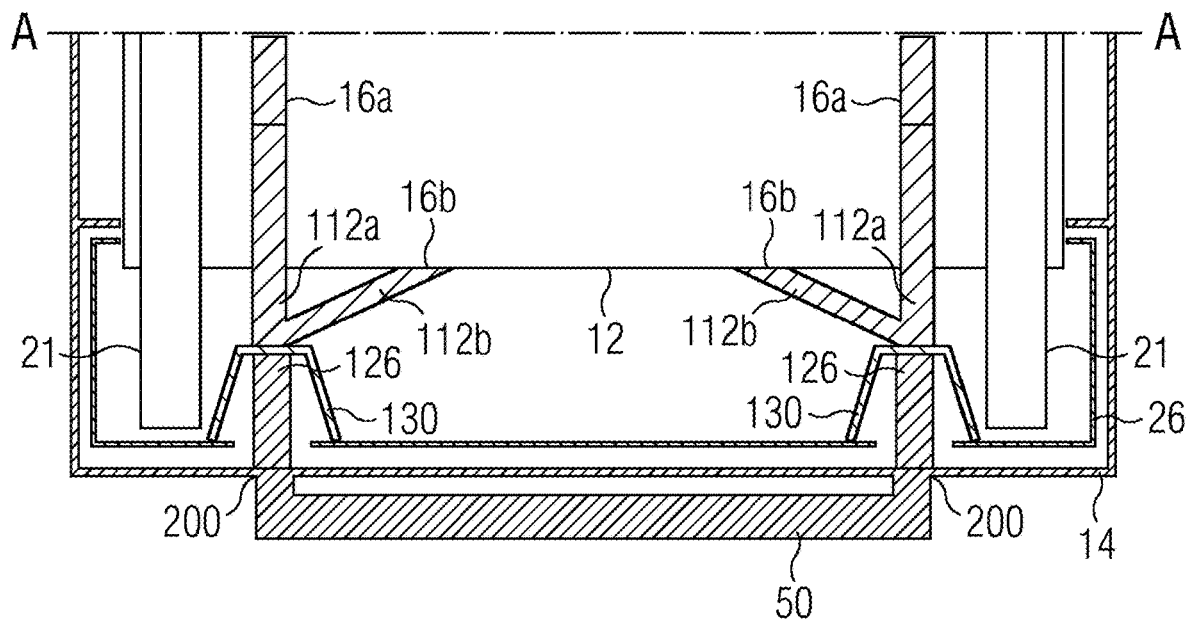
FIG. 3 shows a part-axial schematic radial elevation of an example embodiment of the present disclosure.
Figure 4:
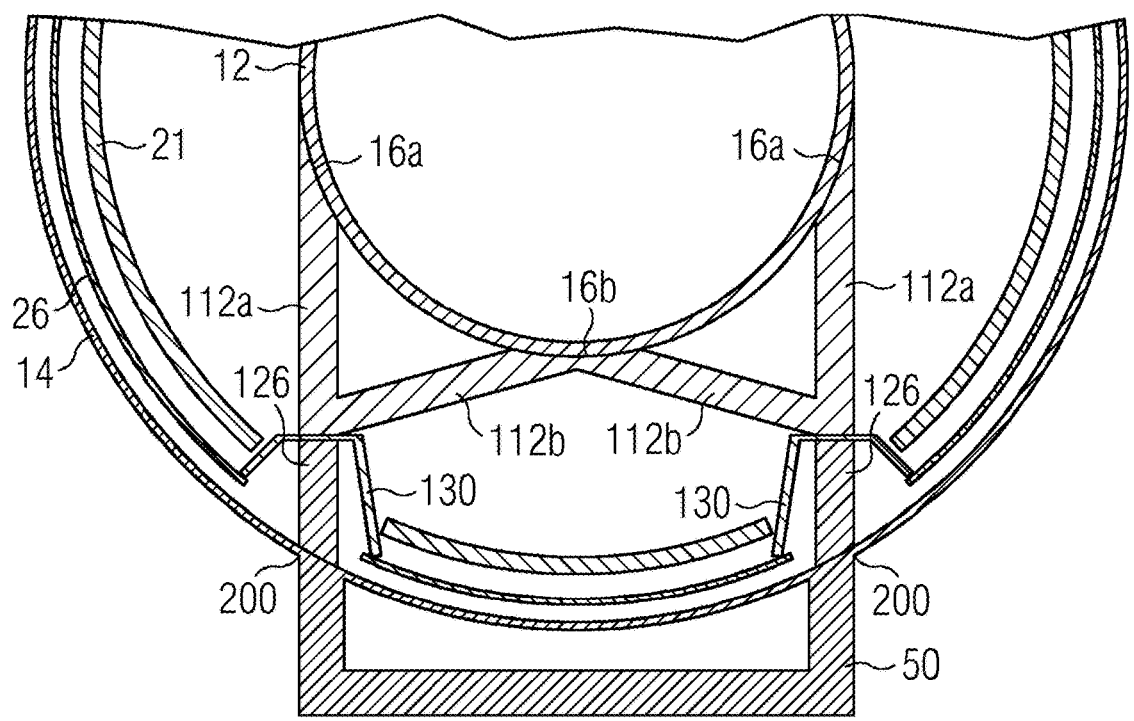
FIG. 4 shows a schematic axial elevation of an example embodiment of the present disclosure.

FIGS. 3-4 respectively show schematic radial and axial elevations of an assembly comprising a superconducting magnet structure 12 supported by a support structure, according to an example embodiment of the present disclosure, and show further detail of W-frame supports 110 and support elements 126. In FIG. 3, only a lower part, below cylindrical axis A-A is shown, for clarity of representation.

In certain embodiments, superconducting magnet structure 12 comprises coils mechanically restrained in required relative positions by other components, such as a former. Shield coils 21 are also shown. Shield coils are a conventional component of superconducting magnets, and comprise coils of a greater radius than the superconducting magnet structure 12. The shield coils 21 are not directly involved in the present disclosure. A bracket 130 is the shield support bracket, providing mechanical support to the thermal radiation shield 26. Bracket 130 may also function as a thermal intercept, being thermally conductive and being thermally linked to both the support structure and the thermal radiation shield so as to carry heat from the support structure to the thermal radiation shield and so on to an associated cryogen refrigerator. The bracket is shown joined to the support structure between the support element 126, which may be a GRP tube, and W-frame support 110. Bracket 130 may be formed as a separate piece and assembled to the remainder of the thermal radiation shield as the superconducting magnet structure is assembled into the vacuum vessel 14. Thermal contact between GRP and CFRP components preferentially occurs at the temperature of the thermal radiation shield that is at about 50K, which is approximately the temperature at which the thermal conductivities of GRP and CFRP are equal. This temperature is provided by the thermal intercept function of bracket 130.

Preferably, as illustrated in FIG. 3, the inner partial cradle surface 16b of each W-frame support 110 contacts a part of the outer surface 44 of the superconducting magnet structure 12 which is axially displaced from a part of the outer surface 44 of the superconducting magnet structure which is contacted by the outer partial cradle surfaces 16a of the W-frame support. This spreads the load bearing for the weight of the superconducting magnet structure 12 to more than one axial region of the superconducting magnet structure 12 and enables robust mechanical support in the axial direction.

In particularly advantageous features of the present disclosure, the W-frame supports 110 are constructed such that the outer supports 112a holding the outer partial cradle surfaces 16a are relatively rigid, having high stiffness in the vertical (substantially tangential) direction but are relatively flexible in the horizontal (axial) direction. On the other hand, the supports 112b holding the circumferentially inner partial cradle surfaces 16b are relatively flexible in the vertical (radial) direction but relatively rigid in the horizontal (axial) direction.

Preferably, the outer supports 112a are also relatively flexible in a radial direction, to take up any differences in thermal expansion between the W-frame supports 110 and the superconducting magnet structure 12.

The terms "relatively rigid" and "relatively flexible" may be interpreted thus: when a given force is applied to a support in a direction in which it is said to be "relatively flexible", then the resultant displacement is greater by a factor x than a displacement resulting from application of the same given force to the same support in a direction in which it is said to be "relatively rigid". According to the present disclosure, x is at least 2, and preferably in the range 5-20, and more preferably 8-15.

Horizontal loading, which may be encountered during transport or during earthquakes, for example, is largely taken by the inner cradle surface 16b, which is supported by inner supports 112b which are relatively rigid in the horizontal directions. The interface surface between inner cradle surface 16b and the outer surface 44 of the superconducting magnet structure is parallel to the horizontal force: the restrained axial force is a shear force at this interface. The supports 112a supporting the outer partial cradle surfaces 16a are relatively flexible in the horizontal directions. They make little contribution to restraining an axial or radial horizontal force, and a force appearing at the interface surface between outer cradle surfaces 16a and the outer surface 44 of the superconducting magnet structure is a rotary shear force at this interface.

Vertical static loading, essentially the weight of the superconducting magnet structure 12, is substantially taken by the outer partial cradle surfaces 16a. The supports 112b supporting the inner partial cradle surface 16b are relatively flexible in the vertical direction and make little contribution to supporting the vertical static load, that is, the weight of the magnet structure. In this manner, most of the vertical loading is taken approximately tangential to the outer surface 44 of the superconducting magnet structure, which minimises a tendency of the superconducting magnet structure to deform. The weight is transmitted substantially tangentially, in which direction the superconducting magnet assembly 12 itself is very rigid. If a significant portion of the weight of the superconducting magnet assembly were taken by the inner partial cradle surface 16b, the resulting point loading would be taken radially by the superconducting magnet assembly 12, in which direction the superconducting magnet assembly is itself relatively flexible. Point loading would lead to regions of high stress within the superconducting magnet structure, which in turn would affect the homogeneity of the magnetic field and increase a tendency to quench.

By adjusting the shape and structure of the W-frame support, and the quantity and lay-up of the material in certain regions it may be arranged that a majority of vertical loading is taken, substantially tangentially, by the outer cradle surfaces 16a, while a majority of the horizontal loading is taken by the inner cradle surface 16b, with little vertical loading taken by the inner cradle surface 16b. The exact ratios of thicknesses, flexibility required and so on will vary depending on the exact design and materials used, and the required characteristics will vary according to the size and mass of the superconducting magnet assembly 12 used. All such characteristics may, however, be derived from a computer simulation as will be evident to those skilled in the art.

The W-frame support 110 should preferably be constructed of only a minimum thickness of material to provide an appropriate mechanical strength, so as to keep to a minimum the thermal conduction path each W-frame support provides from the ambient temperature of the vacuum vessel to the cryogenic operational temperature of the superconducting magnet structure. Minimising the thickness of the material of the W-frame support 110 will mean that the support will flex a certain amount during transport of the superconducting magnet structure.

The support element 126 is preferably mechanically attached to the W-frame support 110. This may be by bonding, bolting or other suitable methods.

Although described above as produced as a single item, the W-frame support may be manufactured as two separate pieces, or more than two pieces, which may be assembled together into a W-frame support, or to perform the function of the W-frame as described above.

For example, each described W-frame could effectively be split into two "V-frames", each comprising a single outer partial cradle surface 16a, a corresponding single supporting strut 112a, a single inner partial cradle surface 16b and a corresponding single supporting strut 112b.

In such an embodiment, each "V-frame" support may contact the vacuum vessel at a single outer partial cradle surface 16a at an outer location and a single inner partial cradle surface 16b contacting the superconducting magnet structure at an inner location. Each would be bonded or bolted or otherwise attached to the superconducting magnet structure and to the vacuum vessel.

In another alternative embodiment, the two W-frame supports 110 shown in the described embodiments may be combined into a single "double-W-frame" support, manufactured in a single step, which preferably includes the single-surface moulding operation discussed above.

The present disclosure accordingly provides a flexible support structure to support a relatively flexible superconducting magnet assembly, wherein the support structure is arranged such that, when assembled, the superconducting magnet assembly and the support structure provide a rigid whole. This problem arises in modern designs of superconducting magnet assembly which do not employ an encasing cryogen vessel. The superconducting magnet structure must be appropriately supported without causing flexure.

While the support structure of the present disclosure is specifically described with reference to the support of superconducting magnet assemblies, the present disclosure may be applied to provide support arrangements for other flexible cylindrical structures.

The invention claimed is:

1. An assembly comprising a cylindrical superconducting magnet assembly supported by a cradle-shaped support structure having at least one support element, each of the at least one support element comprising:
   two outer partial cradle surfaces;
   one inner partial cradle surface joined by corresponding inner support struts, wherein circumferential extremities of the outer partial cradle surfaces subtend an angle β at an axis of the cylindrical superconducting magnet assembly, and the angle β is in a range 60°-180°;
   the inner support struts configured to hold the inner partial cradle surface and being relatively flexible in the vertical, radial direction, but relatively rigid in the horizontal, axial direction: and
   outer supports struts configured to hold the outer partial cradle surfaces and being relatively rigid in a vertical, substantially tangential, direction, but relatively flexible in a horizontal, axial direction,
   wherein, in response to a given force applied to an inner or outer support strut in a direction in which the inner or outer support strut is relatively flexible, a resultant displacement is greater by a factor x than a displacement resulting from application of the same given force to the same inner or outer support strut in a direction in which the inner or outer support strut is relatively rigid, and x is at least 2, and
   wherein vertical and horizontal loads are shear forces by respective partial cradle surfaces, which are substantially parallel to the direction of the respective load, such that vertical loads are in a direction substantially tangential to a cylindrical surface of the cylindrical superconducting magnet assembly, whereby vertical static loading is substantially taken by the outer partial cradle surfaces, and the superconducting magnet assembly is enclosed within a vacuum vessel.

2. The assembly according to claim 1, wherein the support structure comprises a plurality of support elements.

3. The assembly according to claim 2, wherein each of the plurality of support elements is cradle-shaped.

4. The assembly according to claim 1, wherein each of the two outer partial cradle surfaces is supported by a single outer support strut, and the inner partial cradle surface is supported by two inner support struts.

5. The assembly according to claim 1, wherein the angle β is in a range 90°-150°.

6. The assembly according to claim 1, wherein the inner partial cradle surface of each of the at least one support element contacts a part of the radially outer surface of the cylindrical structure which is axially displaced from a part of the radially outer surface of the cylindrical structure which is contacted by the outer partial cradle surfaces.

7. The assembly according to claim 1, wherein x is in a range 5-20.

8. The assembly according to claim 7, wherein x is in a range 8-15.

9. The assembly according to claim 1, wherein each of the at least one support element comprises a single molded surface, and other surfaces of the support element being not molded.

10. The assembly according to claim 1, wherein each of the at least one support element supports a corresponding bracket which provides mechanical support for a thermal radiation shield.

11. The assembly according to claim 10, wherein each bracket is thermally linked to a corresponding support element and thermal radiation shield, such that the bracket provides a thermal intercept to the support element.

12. The assembly according to claim 1, wherein part of the support structure is comprised of glass-reinforced-plastic (GRP), while another part is comprised of carbon-fibre-reinforced-plastic (CFRP).

* * * * *